(12) United States Patent
Yamaoka et al.

(10) Patent No.: US 6,320,805 B1
(45) Date of Patent: Nov. 20, 2001

(54) SEMICONDUCTOR DEVICE WITH EXTERNAL PINS

(75) Inventors: Shigeru Yamaoka; Wataru Sakamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/767,135

(22) Filed: Jan. 23, 2001

(30) Foreign Application Priority Data

Jul. 26, 2000 (JP) ................................................ 12-224720

(51) Int. Cl.[7] .................................................... G11C 7/00
(52) U.S. Cl. ............................................................ 365/201
(58) Field of Search .............................. 365/201; 327/52, 327/53; 371/22.5

(56) References Cited

U.S. PATENT DOCUMENTS 6,208,572 * 3/2001 Adams et al. ........................ 365/201

FOREIGN PATENT DOCUMENTS 4-217341 8/1992 (JP).

* cited by examiner

Primary Examiner—Vu A. Le
(74) Attorney, Agent, or Firm—McDermott, Will & Emery

(57) ABSTRACT

In a high-speed SDRAM, a contact resistance detecting circuit is provided for detecting a contact resistance value between a socket and an external pin. At the time of testing, the contact resistance detecting circuit compares a current flowing from the socket supplied with a power supply potential through the external pin to a first transistor and a constant current flowing from a line of the power supply potential to a second transistor, and, based on the comparison result, outputs a signal of a level corresponding to the contact resistance value.

10 Claims, 5 Drawing Sheets

SEMICONDUCTOR DEVICE WITH EXTERNAL PINS

BACKGROUND OF THE INVENTION

1. Field of the Invention

The present invention relates to semiconductor devices, and more particularly, to a semiconductor device provided with external pins for input and/or output of signals.

2. Description of the Background Art

Conventionally, a semiconductor integrated circuit device provided with a large number of external pins incorporates therein a test circuit for detecting contact failure between respective external pins and board interconnection when mounted on a board.

In a conventional testing method, a signal of an H level is applied to board interconnection, and when the signal at the H level is transmitted via an external pin to a test circuit, it is determined that the contact state of the board interconnection and the external pin is normal. When the signal at the H level is not transmitted to the test circuit via the external pin, the determination is made that the contact between the board interconnection and the external pin is defective.

When a contact resistance value between the board interconnection and the external pin is several ohms, signal transmission timing is delayed by several ten ps, thereby reducing a signal voltage by several ten mV. This poses substantially no problem on a conventional semiconductor integrated circuit device. However, it may cause a fatal problem for a high-speed device such as a DDR SDRAM (double date rate, synchronous dynamic random access memory).

Further, with such a high-speed device, an error in determination of good/defective product may occur at a test before shipment, due to the contact resistance value between the external pin and a socket of a tester.

The same problem may arise when neighboring two external pins are electrically conducted to each other at a high resistance value.

The conventional testing method would only make a digital determination whether the contact state between the external pin and the board interconnection or the socket is normal. Such method is insufficient for testing of the high-speed device.

SUMMARY OF THE INVENTION

Accordingly, an object of the present invention is to provide a semiconductor device that allows detection of a contact resistance value between an external terminal and an external pin.

Another object of the present invention is to provide a semiconductor device that allows detection of a resistance value between external pins.

A semiconductor device according to the present invention is provided with a resistance detecting circuit for detecting a contact resistance value between an external terminal and an external pin in a test mode. Thus, it becomes possible to detect the contact resistance value between the external terminal and the external pin.

Preferably, in the test mode, a power supply potential is supplied to the external terminal. The resistance detecting circuit includes: a first transistor connected between the external pin and a first node and allowing a current of a value corresponding to the contact resistance value to flow therethrough; a second transistor connected between a line of power supply potential and a second node and allowing a current of a prescribed value to flow therethrough; first and second diode elements respectively connected between the first and second nodes and a line of a reference potential; and a comparison circuit comparing potentials at the fist and second nodes and, based on the comparison result, outputting a signal at a level corresponding to the contact resistance value. In this case, the potential at the first node decreases as the contact resistance value increases. Thus, by comparing the potentials at the first and second nodes, the contact resistance value can be obtained.

Still preferably, in the test mode, a power supply potential is supplied to the external terminal. The resistance detecting circuit includes: a first transistor connected between the external pin and a first node and allowing a current of a value corresponding to the contact resistance value to flow therethrough; a second transistor connected between a line of power supply potential and a second node and allowing a current of a prescribed value to flow therethrough; and a current mirror circuit connected between the first and second transistors and a line of reference potential and outputting a signal at a level corresponding to the contact resistance value. In this case, again, the current flowing through the first transistor decreases as the contact resistance value increases. Thus, by comparing the current values flowing through the first and second transistors, it becomes possible to obtain the contact resistance value.

Still preferably, a plurality of external pins are provided, and a resistance detecting circuit is commonly provided for the plurality of external pins. Further, a switching circuit is provided, which selects any external pin from the plurality of external pins and couples the selected external pin to the resistance detecting circuit. In this case, one resistance detecting circuit can detect the contact resistance values of the plurality of external pins.

Still preferably, a monitor pin is further provided, which externally guides an output signal of the resistance detecting circuit. In this case, it becomes readily possible to monitor the output signal of the resistance detecting circuit.

Still preferably, a plurality of sets of external pins and resistance detecting circuits are provided, and further, a monitor pin for externally guiding the output signal of the resistance detecting circuit, and a switching circuit for selecting any resistance detecting circuit from the plurality of resistance detecting circuits and supplying the output signal from the selected resistance detecting circuit to the monitor pin are provided. In this case, it is possible to monitor the output signals from the plurality of resistance detecting circuits with a single monitor pin.

Another semiconductor device according to the present invention is provided with a resistance detecting circuit for detecting a resistance value between a first external pin and a second external pin in a test mode. Thus, it becomes possible to detect the resistance value between the two external pins.

Preferably, in the test mode, a power supply potential is supplied to the first external pin. The resistance detecting circuit includes: a first transistor connected between the second external pin and a first node and allowing a current of a value corresponding to the resistance value between the first and second external pins to flow therethrough; a second transistor connected between a line of power supply potential and a second node and allowing a current of a prescribed value to flow therethrough; first and second diode elements respectively connected between the first and second nodes and a line of a reference potential; and a comparison circuit comparing potentials at the first and second nodes and, based on the comparison result, outputting a signal of a level corresponding to the resistance value between the first and second external pins. In this case, the potential at the first node decreases as the resistance value between the first and second external pins increases. Thus, it becomes possible to obtain the resistance value between the first and second external pins by comparing the potentials at the first and second nodes.

Still preferably, in the test mode, a power supply potential is supplied to the first external pin. The resistance detecting circuit includes: a first transistor connected between the second external pin and a first node and allowing a current of a value corresponding to the resistance value between the first and second external pins to flow therethrough; a second transistor connected between a line of power supply potential and a second node and allowing a current of a prescribed value to flow therethrough; and a current mirror circuit connected between the first and second nodes and a line of reference potential and outputting a signal of a level corresponding to the resistance value between the first and second external pins. In this case, again, the current flowing through the first transistor decreases as the resistance value between the first and second external pins increases. Thus, by comparing the current values flowing through the first and second transistors, it is possible to obtain the resistance value between the first and second external pins.

Still preferably, a monitor pin is further provided for externally guiding an output signal of the resistance detecting circuit. In this case, the output signal of the resistance detecting circuit can readily be monitored.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
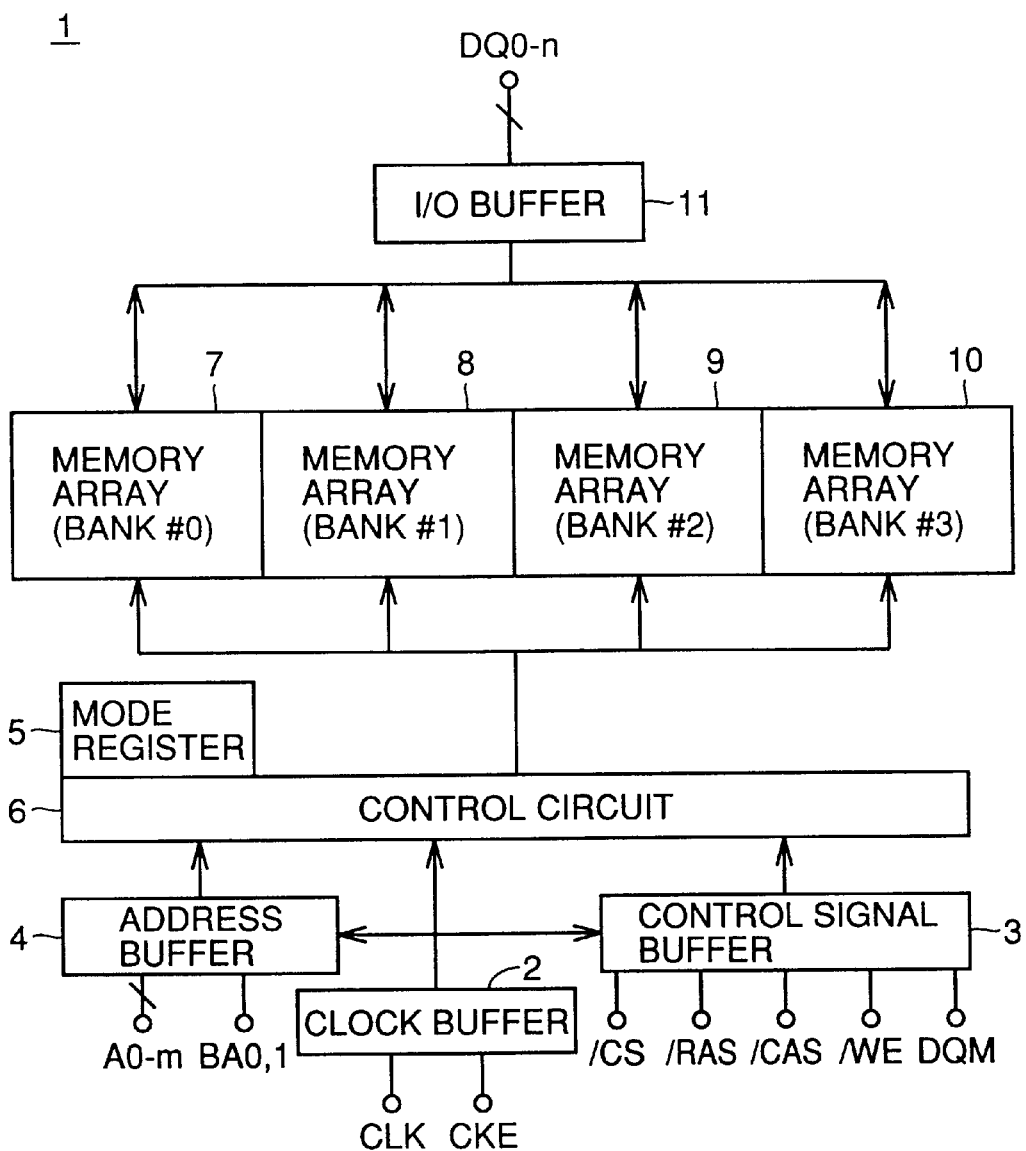
FIG. 1 is a block diagram showing an entire configuration of a SDRAM according to a first embodiment of the present invention.

Referring to FIG. 1, the SDRAM 1 according to the first embodiment includes a clock buffer 2, a control signal buffer 3, an address buffer 4, a mode register 5, a control circuit 6, four memory arrays 7–10 (banks #0–#3), and an I/O buffer 11.

Clock buffer 2 is activated by an external control signal CKE and transmits an external clock signal CLK to control signal buffer 3, address buffer 4 and control circuit 6. Control signal buffer 3 latches external control signals /CS, /RAS, /CAS, /WE and DQM in synchronization with external clock signal CLK from clock buffer 2, and supplies the signals to control circuit 6. Address buffer 4, in synchronization with external clock signal CLK from clock buffer 2, latches external address signals A0–Am (m is an integer at least 0) and bank select signals BA0, BA1, and applies the signals to control circuit 6.

Mode register 5 stores a mode designated by external address signals A0–Am or the like, and outputs an internal command signal corresponding to the mode. Each of memory arrays 7–10 includes a plurality of memory cells arranged in rows and columns, each memory storing data of one bit. The plurality of memory cells are divided into n+1 groups (n is an integer at least 0) in advance.

Control circuit 6 generates various kinds of internal signals according to the signals from control signal buffer 3, address buffer 4 and mode register 5, and controls the entire SDRAM 1. In writing and reading operations, control circuit 6 selects either one of the four memory arrays 7–10 according to bank select signals BA0, BA1, and selects n+1 memory cells from the memory array according to address signals A0–Am. The selected n+1 memory cells are activated and coupled to I/O buffer 11.

In the writing operation, I/O buffer 11 provides the selected n+1 memory cells with data D0–Dn externally supplied. In the reading operation, it externally outputs read data Q0–Qn from the n+1 memory cells.

Figure 2:
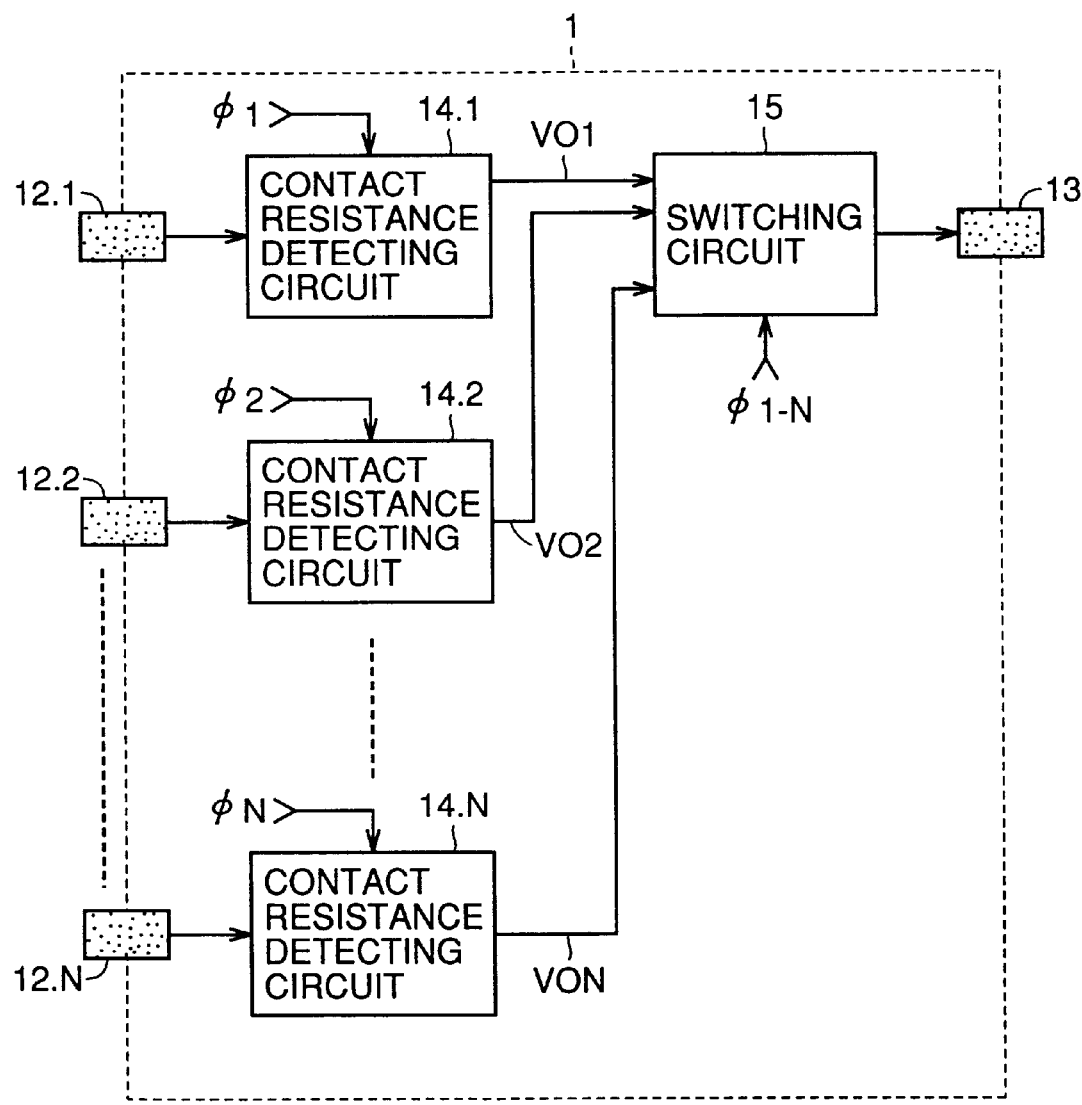
FIG. 2 is a block diagram showing a configuration of a portion of the SDRAM in FIG. 1 associated with a contact test.

Referring to FIG. 2, SDRAM 1 is provided with N+1 (N is an integer at least 1) external pins 12.1–12.N and 13, N contact resistance detecting circuits 14.1–14.N, and a switching circuit 15.

External pins 12.1–12.N are used for input and/or output of various kinds of external signals A0–Am, BA0, BA1, . . . , shown in FIG. 1. External pin 13 is used for monitoring contact resistance values R between external pins 12.1–12.N and their sockets, for example, and resistance values R between respective, neighboring two external pins (e.g., 12.1, 12.2).

Each of contact resistance detecting circuits 14.1–14.N is activated in response to a corresponding signal $\phi 1$–$\phi N$ attaining an H level of an activated level, and provides switching circuit 15 with a signal VO1–VON of a level corresponding to contact resistance value R between the relevant external pin 12.1–12.N and its socket or resistance value R between the relevant external pin and its neighboring pin. Signals $\phi 1$-$\phi N$ are generated at mode register 5 shown in FIG. 1. At the time of contact test of a particular external pin (12.1, for example), a signal corresponding thereto ($\phi$ in this case) is driven to an H level of the activated level.

Figure 3:
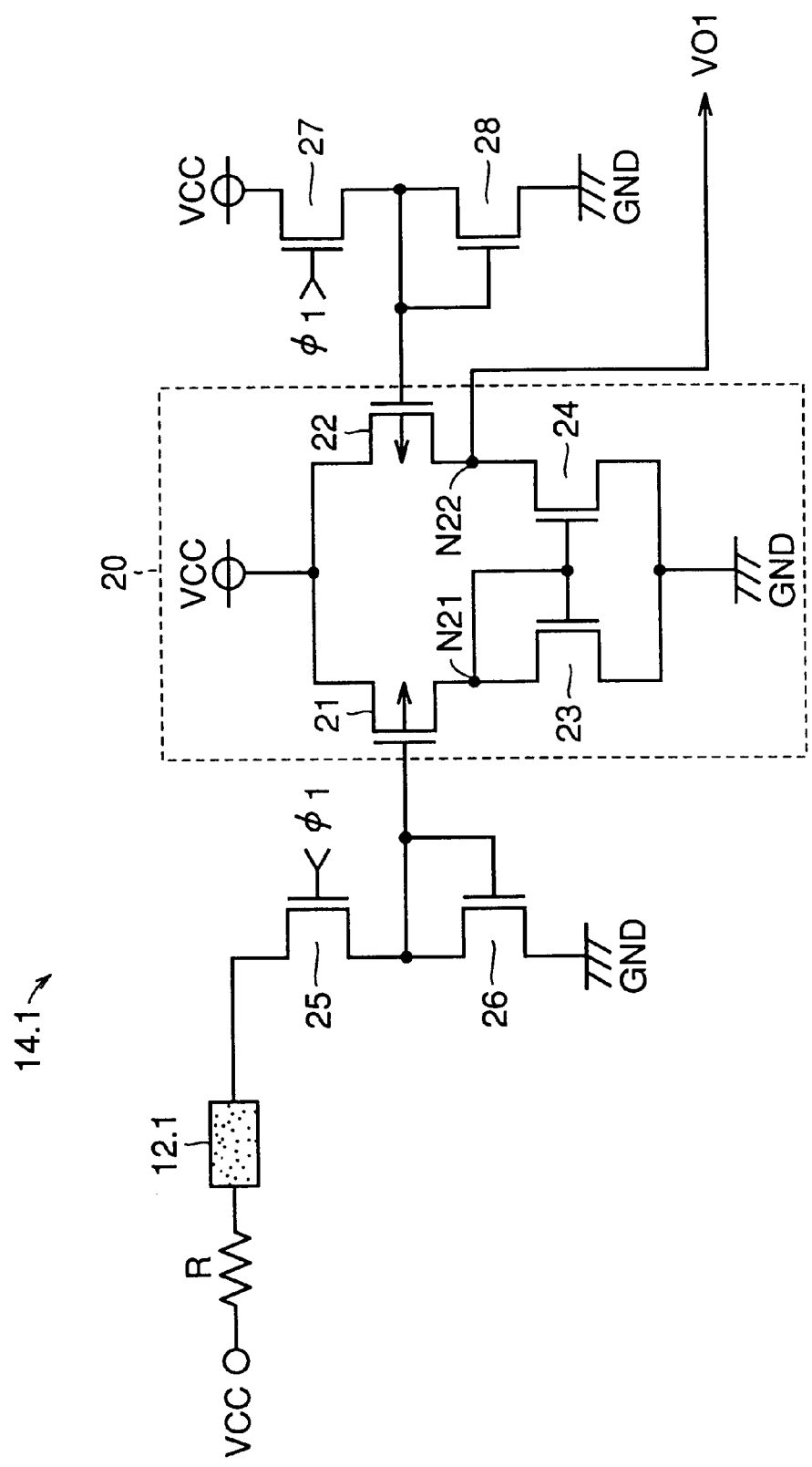
FIG. 3 is a circuit diagram illustrating a configuration of a contact resistance detecting circuit shown in FIG. 2.
Figure 4:
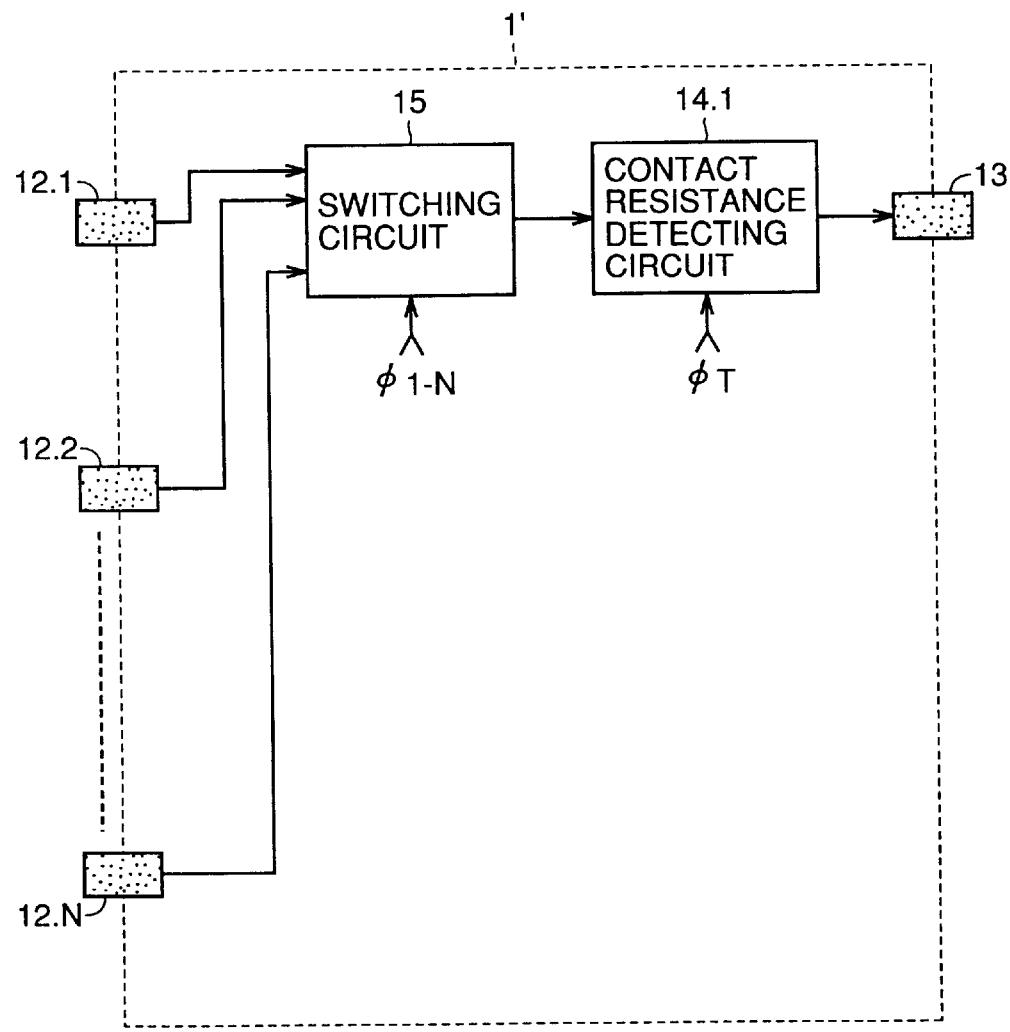
FIG. 4 is a block diagram showing a modification of the first embodiment.

Referring to FIG. 3, contact resistance detecting circuit 14.1 is provided with a comparison circuit 20 and N channel MOS transistors 25–28. Comparison circuit 20 includes P channel MOS transistors 21, 22 and N channel MOS transistors 23, 24. N channel MOS transistors 25, 26 are connected in series between external pin 12.1 and a line of ground potential GND. N channel MOS transistors 27, 28 are connected in series between a line of power supply potential VCC and a line of ground potential GND. The gates of N channel MOS transistor 25, 27 both receive signal $\phi 1$. The gates of N channel MOS transistors 26, 28 are connected to their respective drains.

MOS transistors 21 and 23 of comparison circuit 20 are connected in series between a line of power supply potential VCC and a line of ground potential GND. Similarly, MOS transistors 22 and 24 in comparison circuit 20 are connected in series between power supply potential VCC line and ground potential GND line. The gates of P channel MOS transistors 21, 22 are connected to the gates of N channel MOS transistors 26, 28, respectively. The gates of N channel MOS transistors 23, 24 are both connected to the drain of N channel MOS transistor 23. N channel MOS transistors 23, 24 constitute a current mirror circuit. The drain (a node N22) of P channel MOS transistor 22 serves as an output node N22 for this contact resistance detecting circuit 14.1

When signal φ1 is at an L level of an inactivated level, N channel MOS transistors 25, 27 are rendered non-conductive, and contact resistance detecting circuit 14.1 is inactivated. When signal φ1 is at an H level of the activated level, N channel MOS transistors 25, 27 are rendered conductive, and contact resistance detecting circuit 14.1 is activated. Each of the conductive N channel MOS transistors 25, 27 constitutes a resistance element. At the time of contact test, power supply potential VCC is supplied to a socket, for example. A voltage drop occurs due to contact resistance value R between the socket and external pin 12.1, and the potential of external pin 12.1 becomes lower than power supply potential VCC. Thus, the gate potentials of MOS transistors 26, 21 become lower than the gate potentials of MOS transistors 28, 22, and the current flowing through P channel MOS transistor 21 becomes greater than the current flowing through P channel MOS transistor 22.

Since P channel MOS transistor 21 and N channel MOS transistor 23 are connected in series and N channel MOS transistors 23 and 24 constitute a current mirror circuit, the current of the same value flows through MOS transistors 21, 23 and 24. The potential VO1 of node N22 is determined by a ratio between the current flowing through P channel MOS transistor 22 and the current flowing through MOS transistors 21, 23 and 24. The greater the contact resistance value R, the greater the current flowing through MOS transistors 21, 23 and 24, and the potential VO1 of node N22 decreases. Thus, by detecting the potential VO1, contact resistance value R can be detected.

Returning to FIG. 2, switching circuit 15 receives output signals VO1–VON from contact resistance detecting circuits 14.1–14.N. It applies to external pin 13, only the output signal (VO1, for example) received from the contact resistance detecting circuit corresponding to the signal (φ1 in this case) that attained an H level of the activated level among signals φ1–φN.

The operation of SDRAM 1 at the time of contact test will now be described. First, external pins 12.1–12.N of SDRAM 1 are inserted into respective sockets, to which power supply potential VCC is applied. External pin 13 for use in monitoring is connected to a voltmeter. Next, signals φ1–φN are sequentially activated to an H level, each for a prescribed time period. Thus, signals VO1–VON each of a level corresponding to the contact resistance value R between corresponding external pin 12.1–12.N and its socket are sequentially output to external pin 13. From the levels of signals VO1–VON, contact resistance values R of respective external pins 12.1–12.N and their sockets are obtained.

When the resistance value between neighboring two external pins (e.g., 12.1, 12.2) is being detected, power supply potential VCC is applied to external pin 12.2, external pin 12.1 is brought to a floating state, and signal φ1 is driven to an H level of the activated level. Thus, signal VO1 of a level corresponding to the resistance value R between external pins 12.1 and 12.2 is output to external pin 13. From the level of signal VO1, resistance value R between external pins 12.1 and 12.2 is determined.

In the first embodiment, contact resistance detecting circuits 14.1–14.N with the same number as external pins 12.1–12.N have been provided. However, one contact resistance detecting circuit 14.1 may be provided commonly for external pins 12.1–12.N. In this case, any one of external pins 12.1–12.N is selectively connected by switching circuit 15 to contact resistance detecting circuit 14.1, and the output signal of contact resistance detecting circuit 14.1 is directly provided to external pin 13 for monitoring. This contact resistance detecting circuit 14.1 is controlled by a signal φT instead of signal φ1. Signal φT attains an H level when either one of signals φ1–φN is at an H level of the activated level.

Second Embodiment

Figure 5:
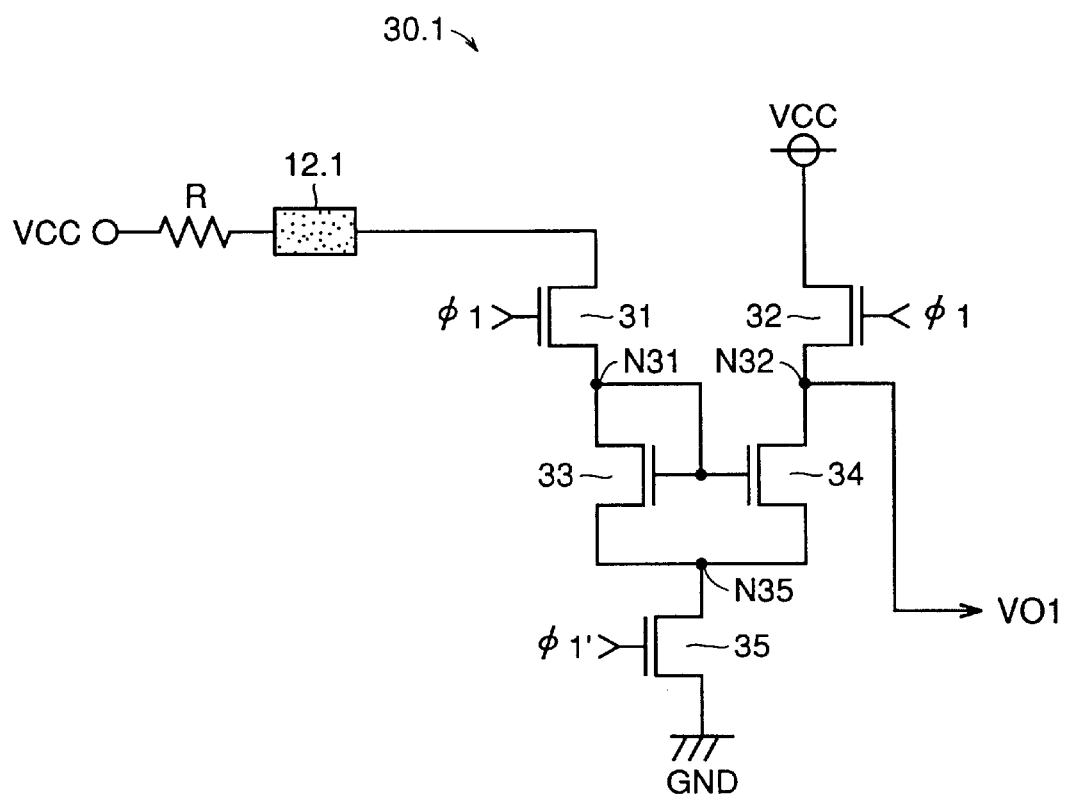
FIG. 5 is a circuit diagram showing a configuration of a contact resistance detecting circuit of a SDRAM according to a second embodiment of the present invention.

A configuration of a contact resistance detecting circuit 30.1 of the SDRAM according to the second embodiment is shown in FIG. 5, which is contrasted with FIG. 3.

Referring to FIG. 5, contact resistance detecting circuit 30.1 includes N channel MOS transistors 31–35. N channel MOS transistors 31, 33 are connected in series between external pin 12.1 and a node N35. N channel MOS transistors 32, 34 are connected in series between a line of power supply potential VCC and node N35. N channel MOS transistors 31, 32 have their gates receiving signal φ1. N channel MOS transistors 33, 34 have their gates both connected to the drain (a node N31) of N channel MOS transistor 33. N channel MOS transistors 33, 34 constitute a current mirror circuit. N channel MOS transistor 35 is connected between node N35 and a line of ground potential GND, and has its gate receiving a delayed signal φ1' of signal φ1. The source (a node N32) of N channel MOS transistor 32 serves as an output node of this contact resistance detecting circuit 30.1

When signal φ1 is at an L level of the inactivated level, N channel MOS transistors 31, 32 and 35 are rendered non-conductive, and contact resistance detecting circuit 30.1 is inactivated. When signal φ1 attains an H level of the activated level, N channel MOS transistors 31 and 32 are rendered conductive. Signal φ1' then attains an H level of the activated level, N channel MOS transistor 35 is rendered conductive, and contact resistance detecting circuit 30.1 is activated. The conductive N channel MOS transistors 31, 32 and 35 each constitute a resistance element.

At the time of contact test, power supply potential VCC is supplied to a socket, for example. A voltage drop then occurs due to contact resistance value R between the socket and external pin 12.1, and the potential of external pin 12.1 becomes lower than power supply potential VCC. Thus, the current flowing through N channel MOS transistor 31 becomes smaller than the current flowing through N channel MOS transistor 30.

Since N channel MOS transistors 31 and 33 are connected in series and N channel MOS transistors 33 and 34 constitute a current mirror circuit, the current of the same value flow through N channel MOS transistors 31, 33 and 34. The potential VO1 of node N32 is determined by a ratio between the current flowing through N channel MOS transistor 32 and the current flowing through N channel MOS transistors 31, 33 and 34. As contact resistance value R increases, the current flowing through N channel MOS transistors 31, 33 and 34 decreases, and the potential VO1 of node N32 becomes greater. Thus, contact resistance value R can be detected by detecting the potential VO1. Other configurations and operations of the second embodiment are identical to those of the first embodiment, and therefore, description thereof is not repeated.

According to the second embodiment, when signals φ1 and φ1' are at an L level of the inactivated level, no current flows from the line of power supply potential VCC through contact resistance detecting circuit 30.1 to the line of ground potential GND. Thus, it becomes possible to reduce the current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device provided with an external pin connected to an external terminal for input and/or output of a signal, comprising:
    a resistance detecting circuit for detecting a contact resistance value between said external terminal and said external pin in a test mode.

2. The semiconductor device according to claim 1, wherein
    a power supply potential is applied to said external terminal in said test mode, and
    said resistance detecting circuit includes
        a first transistor connected between said external pin and a first node, and rendered conductive in said test mode for allowing a current of a value corresponding to said contact resistance value to flow therethrough,
        a first diode element connected between said first node and a line of a reference potential,
        a second transistor connected between a line of the power supply potential and a second node, and rendered conductive in said test mode for allowing a current of a predetermined value to flow therethrough,
        a second diode element connected between said second node and said line of the reference potential, and
        a comparison circuit comparing potentials at said first and second nodes and, based on the comparison result, outputting a signal of a level corresponding to said contact resistance value.

3. The semiconductor device according to claim 1, wherein
    a power supply potential is applied to said external terminal in said test mode, and
    said resistance detecting circuit includes
        a first transistor connected between said external pin and a first node, and rendered conductive in said test mode for allowing a current of a value corresponding to said contact resistance value to flow therethrough,
        a second transistor connected between a line of the power supply potential and a second node, and rendered conductive in said test mode for allowing a current of a predetermined value to flow therethrough, and
        a current mirror circuit connected between said first and second nodes and a line of a reference potential, and comparing the current values flowing through said first and second transistors and, based on the comparison result, outputting a signal of a level corresponding to said contact resistance value.

4. The semiconductor device according to claim 1, wherein
    a plurality of said external pins are provided, and
    said resistance detecting circuit is commonly provided for said plurality of external pins,
    the semiconductor device further comprising:
        a switching circuit selecting any of said plurality of external pins and coupling the selected external pin to said resistance detecting circuit.

5. The semiconductor device according to claim 1, further comprising:
    a monitor pin for externally guiding an output signal of said resistance detecting circuit.

6. The semiconductor device according to claim 1, wherein
    a plurality of sets of said external pins and said resistance detecting circuits are provided,
    the semiconductor device further comprising:
        a monitor pin for externally guiding an output signal of said resistance detecting circuit; and
        a switching circuit selecting any of said plurality of resistance detecting circuits and applying an output of the selected resistance detecting circuit to said monitor pin.

7. A semiconductor device provided with first and second external pins each for input and/or output of a signal, comprising:
    a resistance detecting circuit for detecting a resistance value between said first and second external pins in a test mode.

8. The semiconductor device according to claim 7, wherein
    a power supply potential is applied to said first external pin in said test mode, and
    said resistance detecting circuit includes
        a first transistor connected between said second external pin and a first node, and rendered conductive in said test mode for allowing a current of a value corresponding to the resistance value between said first and second external pins to flow therethrough,
        a first diode element connected between said first node and a line of a reference potential,
        a second transistor connected between a line of the power supply potential and a second node, and rendered conductive in said test mode for allowing a current of a predetermined value to flow therethrough,
        a second diode element connected between said second node and said line of the reference potential, and
        a comparison circuit comparing potentials at said first and second nodes and, based on the comparison result, outputting a signal of a level corresponding to the resistance value between said first and second external pins.

9. The semiconductor device according to claim 7, wherein
    a power supply potential is applied to said first external pin in said test mode, and said resistance detecting circuit includes
- a first transistor connected between said second external pin and a first node, and rendered conductive in said test mode for allowing a current of a value corresponding to the resistance value between said first and second external pins to flow therethrough,
- a second transistor connected between a line of the power supply potential and a second node, and rendered conductive in said test mode for allowing a current of a predetermined value to flow therethrough, and
- a current mirror circuit connected between said first and second nodes and a line of a reference potential, and comparing the current values flowing through said first and second transistors and, based on the comparison result, outputting a signal of a level corresponding to the resistance value between said first and second external pins.

10. The semiconductor device according to claim 7, further comprising:

a monitor pin for externally guiding an output signal of said resistance detecting circuit.

* * * * *

UNITED STATES PATENT AND TRADEMARK OFFICE
CERTIFICATE OF CORRECTION

PATENT NO.   : 6,320,805 B1
DATED        : November 20, 2001
INVENTOR(S)  : Shigeru Yamaoka et al.

It is certified that error appears in the above-identified patent and that said Letters Patent is hereby corrected as shown below:

Title page,
Item "[30] Foreign Application Priority Data", please change the foreign priority number from "12-224720" to -- 2000-224720 --.

Signed and Sealed this

Twenty-eighth Day of May, 2002

Attest:

*Attesting Officer*

JAMES E. ROGAN
*Director of the United States Patent and Trademark Office*